United States Patent
Cole

[19]

[11] Patent Number: 6,130,465
[45] Date of Patent: Oct. 10, 2000

[54] MICRO-SOLAR ASSEMBLY

[75] Inventor: W. Parke Cole, Malibu, Calif.

[73] Assignee: Light Point Systems Inc.

[21] Appl. No.: 08/960,603

[22] Filed: Oct. 29, 1997

[51] Int. Cl.[7] .................................................. H01L 27/14
[52] U.S. Cl. ...................... 257/431; 136/243; 136/244; 136/252; 323/906
[58] Field of Search ................................ 257/431–437; 136/243, 244, 249, 252; 323/906

[56] References Cited

U.S. PATENT DOCUMENTS

| | | | |
|---|---|---|---|
| 3,757,511 | 9/1973 | Burgess et al. | 58/50 |
| 3,912,539 | 10/1975 | Magee | 136/89 |
| 3,952,324 | 4/1976 | Wolff et al. | 136/89 |
| 4,050,834 | 9/1977 | Lee | 404/16 |
| 4,257,821 | 3/1981 | Kelly et al. | 136/244 |
| 4,456,782 | 6/1984 | Nishiura et al. | 136/244 |
| 4,481,378 | 11/1984 | Lesk | 136/244 |
| 4,551,669 | 11/1985 | Itoh et al. | 323/268 |
| 4,567,316 | 1/1986 | Hollaus et al. | 136/246 |
| 4,581,716 | 4/1986 | Kamiya | 364/900 |
| 4,910,415 | 3/1990 | Yoshimura | 307/147 |
| 5,616,185 | 4/1997 | Kukulka | 136/244 |
| 5,801,512 | 9/1998 | Adams et al. | 320/61 |

*Primary Examiner*—David Hardy
*Attorney, Agent, or Firm*—Philip T. Virga

[57] ABSTRACT

A method and apparatus for providing an automated process for fabricating a micro-solar assembly (66) consist of using printed circuit board manufacturing and etching techniques to provide first (8) and opposing (10) charge pathways. Printed circuit board techniques and its connection methodologies when applied to the fabrication of a micro-solar assembly (66) allows the solar chip (54) and diode (42) to be picked, placed and electrically and structurally bonded mechanically onto a printed circuit board (2), then covered with a polymer sealant (12) sprayed for impact resistance and electrical insulation, and additionally covered with a plastic lens cover (18) to focus light and facilitate automated insertion.

8 Claims, 11 Drawing Sheets

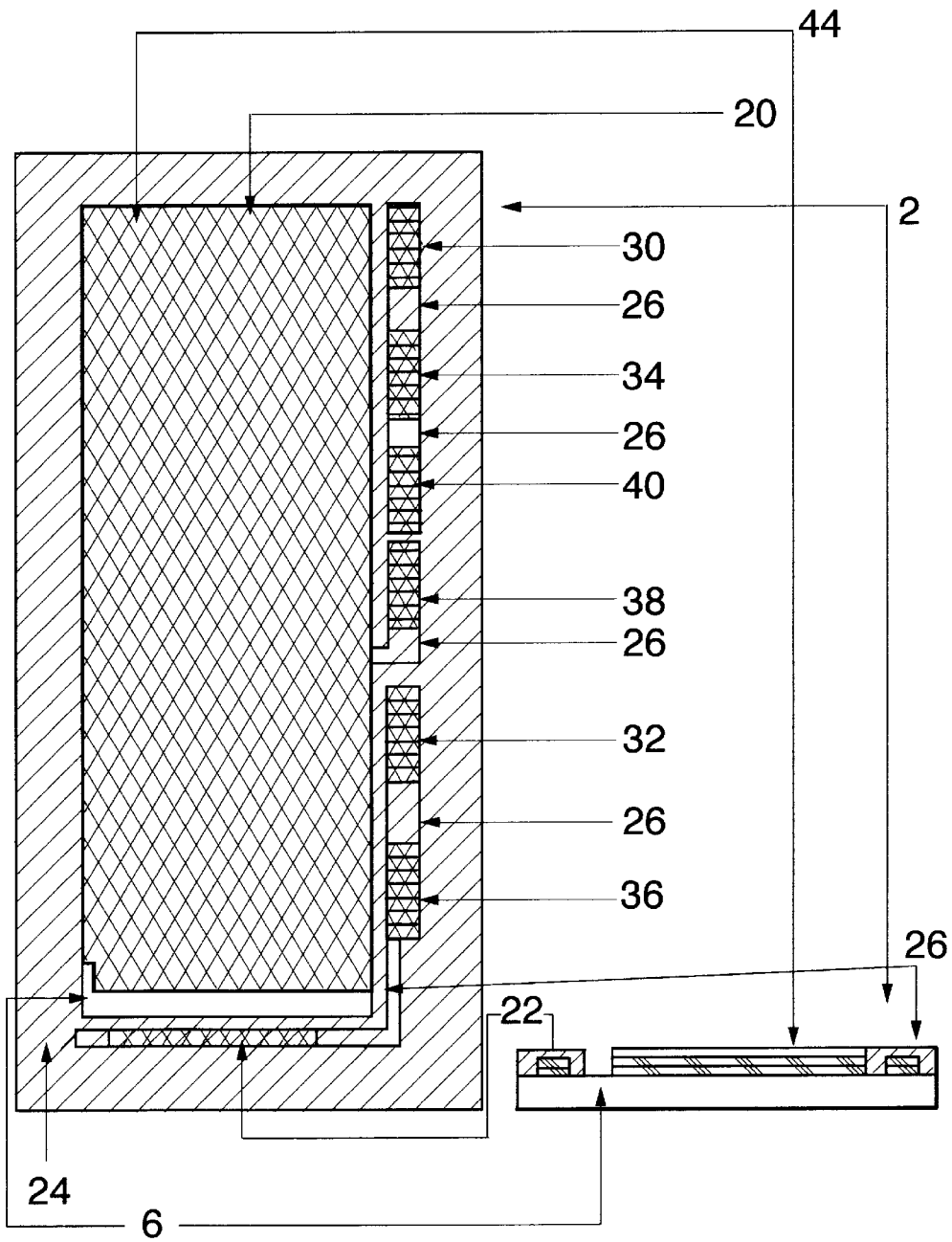
FIGURE 4A                    FIGURE 4B

MICRO-SOLAR ASSEMBLY

BACKGROUND OF THE INVENTION

The present invention relates to a method for the manufacture of a photoelectric charging device. In particular, the present invention relates to a fully automated process of placing and electrically connecting a solar chip on a printed circuit board to provide supplemental photoelectric charge to portable & non portable electronic devices.

It is well known that there is a need for battery charging alternatives for use by portable electronics and more specifically, rechargeable communication devices. One solution that has satisfied this need is the use of micro-solar assemblies for providing supplemental photoelectric charge for the purpose of solar charging these device's batteries. Typically, a micro-solar assembly is comprised of a small light gathering area made of at least one solar chip and diode in series to provide positive current flow and prevent the back flow of current in low light. Preferably, these solar chips are the result of dicing pieces of a standard 4"×4" solar cell. The dicing of solar cells into solar chips allows a manufacturer to create micro solar assemblies of specific sizes.

To date, the process of fabricating micro-solar assemblies is labor intensive requiring many steps to be done by hand. The past process of fabrication consisted of individually soldering the diced chips twice for the positive and negative connections; placing the diced chips on a backing to create a placement and to provide structural integrity, and then sealing the diced chips to the backing by a two part UV resistant polymer to provide impact resistance.

Individual hand soldering of solar chips is a time consuming process fraught with human error and requiring skilled labor to be successful. A micro-solar assemblies require two solder connections for each solar chip as well as numerous gangly connections to ancillary devices and the electronic device being charged. Therefore, there is a need for the removal of hand soldering to be replaced by an automation technique which will greatly reduce the cost and time associated with this process step.

Next, backing substrates or plates, while necessary and simple in nature, are full of inherent problems. These problems arise with the need for exact placement of the small solar chips by human hand onto the backing substrates, a technique which provides inadequate alignment. Also, there is the problem of getting the solar chips to lay flat on the backing substrate or plate. The bottom solder joint generally has some thickness and this thickness varies because of the hand operation. When the chips do not sit flat they are subject to breakage from the fulcrum created underneath each chip by the solder joint. Therefore, there is a need for an automated process that will provide the exact alignment and placement of the solar chips while simultaneously having the solar chips lay as flat as possible on its plate during the bonding process.

Additional problems arise from the differential temperature expansion and contraction between the solar cell and the backing plate which result in the breaking of chips and/or their electrical connections. While temperature resistant plates can be used, there is a need to bond the cell to the plate to act as a single unit which does not result in breakage of the electrical connection. Lastly, problems arise during the polymer coating phase from the nature of using two part viscous polymers. The curing times, air entraining properties, and bonding properties make quick production style usage problematic.

While some of the aforementioned methods are desirable, none of the methods or apparatus describe above provide an automated process which provides a consistently high quality, low cost micro-solar array for use in charging portable electronic devices. The subject invention herein solves all of these problems in a new and unique manner which has not been part of the art previously.

SUMMARY OF THE INVENTION

A method and apparatus for providing an automated process for fabricating a micro-solar assembly consist of using printed circuit board manufacturing techniques. Printed circuit board techniques and its connection methodologies when applied to the fabrication of a micro-solar assembly allows the solar chip and diode to be picked, placed and soldered mechanically onto a printed circuit board and then polymer sprayed for impact resistance with little to no hand labor intervention.

The fabrication technique of the present invention begins with using a standard printed circuit board having been etched to define trace and connection pad areas. The printed circuit board is then masked and said mask etched to further define masked trace areas and connection pad areas. One type of connection pad area, a first charge cell pad area, defines approximately the outer dimension that receives a solar chip which has been pre-cut from a solar cell to lay precisely on top of said first charge cell pad area. A unique feature of the solar chip is that it is cut to have an opposing charge main bus bar on one edge or part of one edge of the solar chip. Additionally two diode connection areas are defined to receive the placement of a diode, and an opposing charge connecting pad area.

The solar chip and diode are placed onto the pad by an automated pick and place machine, well known in the art for placing electrical device components onto printed circuit boards thereby providing precise placement of a solar chip to a cell connection pad.

Then an electrical and structural bonding material is applied to the printed circuit board in the first charge cell pad area and two diode connection areas. The conductive epoxy is applied by screen technologies or automated fluid dispensing equipment in mass production.

The first charge cell pad area on the printed circuit board provides an electrical and structural contact and bonding area to connect the positive bottom first charge side of the solar chip to the printed circuit board with the use of an conductive epoxy or solder paste. An additional key component, a diode, is identically and simultaneously placed for bonding with the solar chip to two said diode connection areas creating a circuit pathway from the bottom of the solar chip to the other side of the diode. The solar chip and diode are bonded by baking in IRC ovens similar to applying semiconductor chips to circuit boards.

After the solar chip is structurally and electrically bonded by its bottom positive first charge side to the first charge cell area of a printed circuit board an additional electrical connection is made from the top negative opposing charge, light gathering side of the solar chip by use of said opposing charge main bus bar located along an edge of the solar chip to an adjacent opposing charge connecting pad area using conductive epoxies, soldering, or wire bonding technologies. Once again, with the positive bottom first charge side of the solar chip connected to the printed circuit boards first charge cell pad area and the top negative opposing charge light gathering side of the solar chip electrically connected to an adjacent opposing charge connecting pad area an electric circuit is established for providing photoelectric charge.

With the solar chip both structurally and electrically connected to the printed circuit board additional connections may be implemented to add low profile micro voltage regulators, light emitting diodes, current & voltage sensing devices, and power outputs. The voltage regulators provides a more constant and specific voltage in varying lighting situations to devices being charged. The light emitting diode stops any reverse flow of current in low light situations while showing the user when current is flowing. The current and voltage sensing devices are used to inform users about optimum placement and status of charge. Then, a sealing polymer compound is spray applied to electrically insulate, increase the impact resistance of the assembly and provide a first lens cover. Lastly, as an additional protective measure and light focusing device a plastic lens cover is secured to the printed circuit board. The micro-solar assembly is now for finished insertion into an electronic device.

Another object of the present invention is to provide a method and apparatus for fabricating micro-solar assembly which fully automates the placement of a solar chip and other electronic components for accuracy, speed, and low cost.

Yet, still another object of the present invention is to provide a method and apparatus for fabricating micro-solar assembly which is fully compatible to current electronic component assemblies.

Still, yet another object of the present invention is to provide a method and apparatus for fabricating micro-solar assembly which provides a backing material that becomes integral with a solar chip and that can withstand varying and high temperatures.

Accordingly, it is an object of the present invention to provide a method and apparatus for fabricating micro-solar assembly by providing automated electrical connections and placement and having an ultra thin profile for its electrical connection and sealing polymer and lens.

BRIEF DESCRIPTION OF THE DRAWINGS

The above, as well as other, advantages of the present invention will become readily apparent to those skilled in the art from the following detailed descriptions of the preferred embodiment in light of the accompanying drawings in which:

FIG. 4A is a front plan view of a tinned printed circuit board constructed in accordance with the present invention;

FIG. 4B is a side sectional view of a tinned printed circuit board constructed in accordance with the present invention;

REFERENCE NUMBERS IN DRAWINGS

2 Printed Circuit Board
4 Bare etched copper trace and pad connection areas
6 Bared Plastic/Paper PC Board Substrate
8 First Charge Pathway
10 Opposing Charge Pathway
12 Electrical and Structural Bonding Material
14 Insulator
16 Polymer Sealant
18 Plastic Lens Cover
20 First Charge Cell Pad Area
22 Opposing Charge Connecting Pad Area
24 Mask
26 Masked Trace
28 Mask surrounding the First Charge Cell Pad
30 First Charge Power Output Connection Area
32 Opposing Charge Power Output Connection Area
34 First Charge Component Device Connection Area
36 Opposing Charge Component Device Connection Area
38 Diode Connection Area One
40 Diode Connection Area Two 42 Light Emitting Diode
44 Tinning
46 Micro Voltage Regulator First Charge Connection
48 Micro Voltage Regulator Opposing Charge Connection
50 Voltage & Current Sensing Device First Charge Connection
52 Voltage & Current Sensing Device Opposing Charge Connection
54 Solar Chip
56 Bottom First Charge Conductive Grid Side
58 Top Opposing Charge, Light Gather Side
60 Edge of Solar Chip with Busbar
62 Opposing Charge Main Bus Bar
64 Electrical Fingers
66 Micro Solar Array
68 First Charge Electronic Device connection
70 Opposing Charge Electronic Device connection

DESCRIPTION OF THE PREFERRED EMBODIMENTS

Figures 1A, 1B:
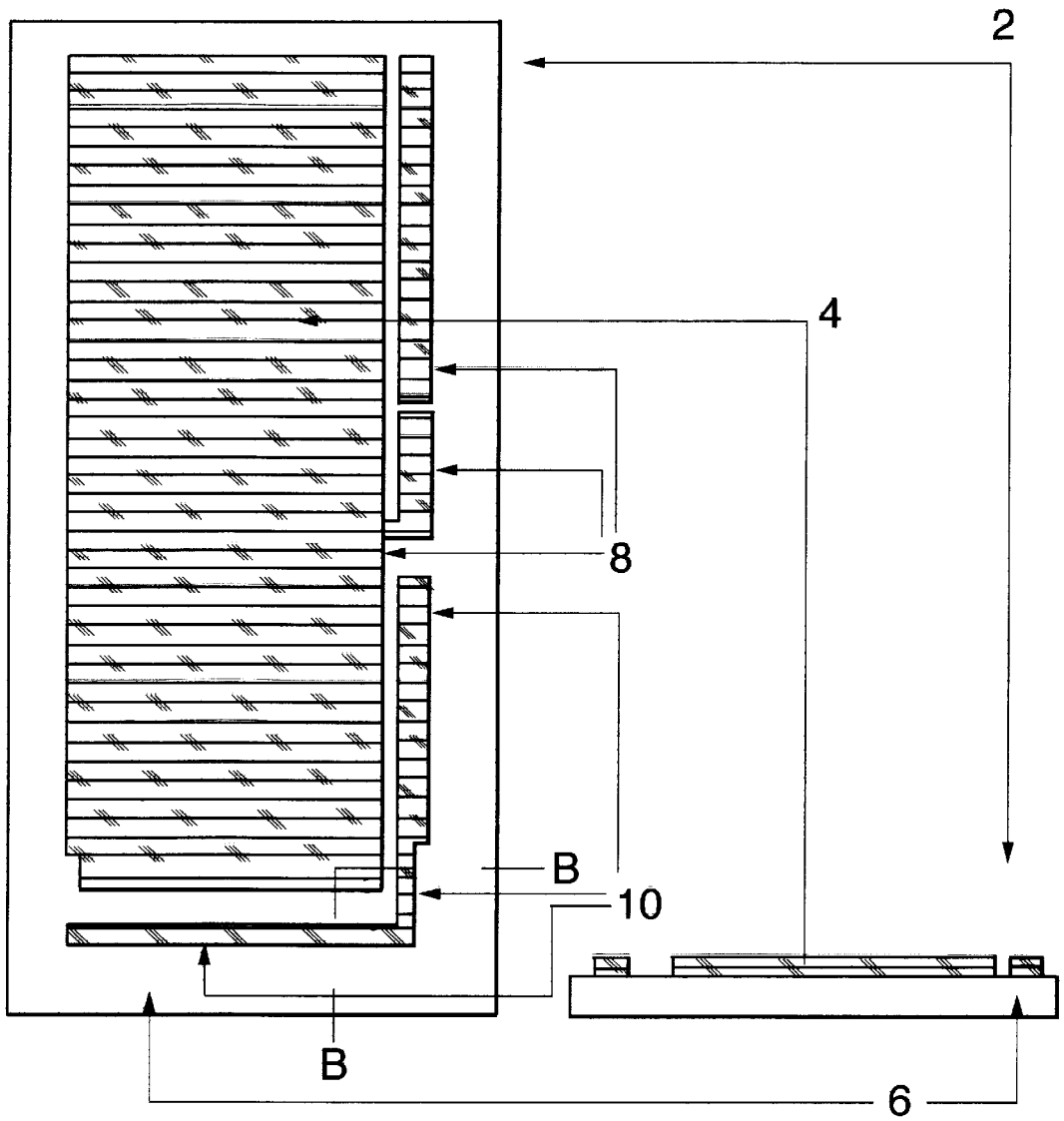
FIG. 1A is a front plan view of a etched copper printed circuit board constructed in accordance with the present invention.
FIG. 1B is a side sectional view of a etched copper printed circuit board constructed in accordance with the present invention.

Referring now to the drawings wherein like reference numerals refer to like and corresponding parts throughout, and more particularly to FIGS. 1A and 1B, the method for fabricating a micro-solar assembly begins with a printed circuit board 2 which has been chemically etched to expose bare etched copper trace and pad connection areas 4 further defining three copper trace and pad connection areas to be used for the positive first charge pathway 8 and negative opposing charge pathway 10 to be described below. In the preferred embodiment, printed circuit board technology is used for its property of having exacting (to the 10,000$^{th}$ of an inch) electrical pathway and connection areas called traces and pads respectively. By using already established etching technologies the board provides large and small connection surfaces for use by automated pick and place machines that provide exacting placement of a solar chip 54, light emitting diode 42, ancillary component devices at the first charge component device connection area 34 and opposing charge component device connection area 36, and charged device at the first charge power output connection area 30 and opposing charge power output connection area 32, to fabricate a micro-solar assembly as will be more fully described below in FIGS. 8A and 8B, 9A and 9B.

Figures 2A, 2B:
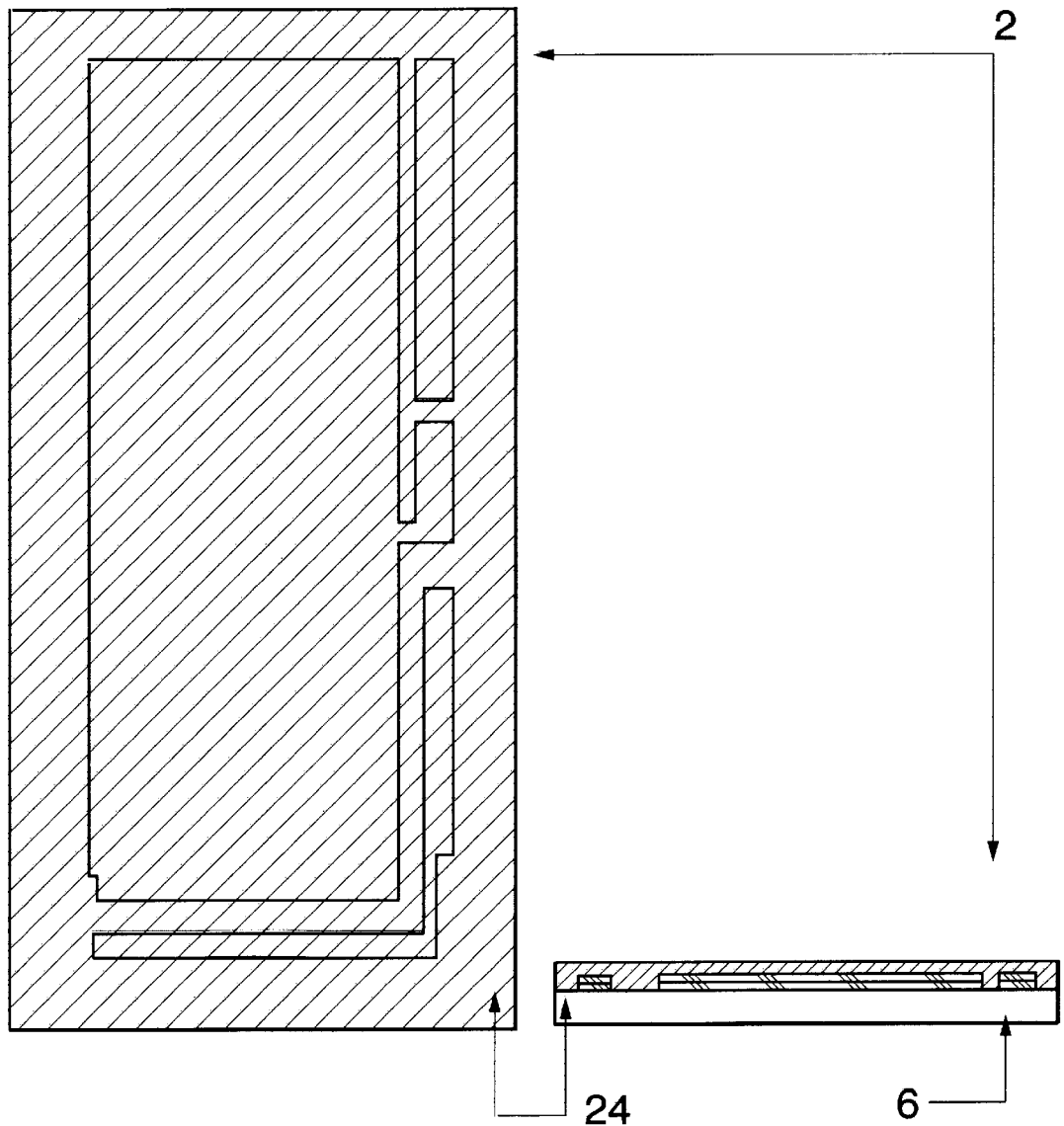
FIG. 2A is a front plan view of a masked printed circuit board constructed in accordance with the present invention.
FIG. 2B is a side sectional view of a masked printed circuit board constructed in accordance with the present invention.
Figures 7A, 7B:
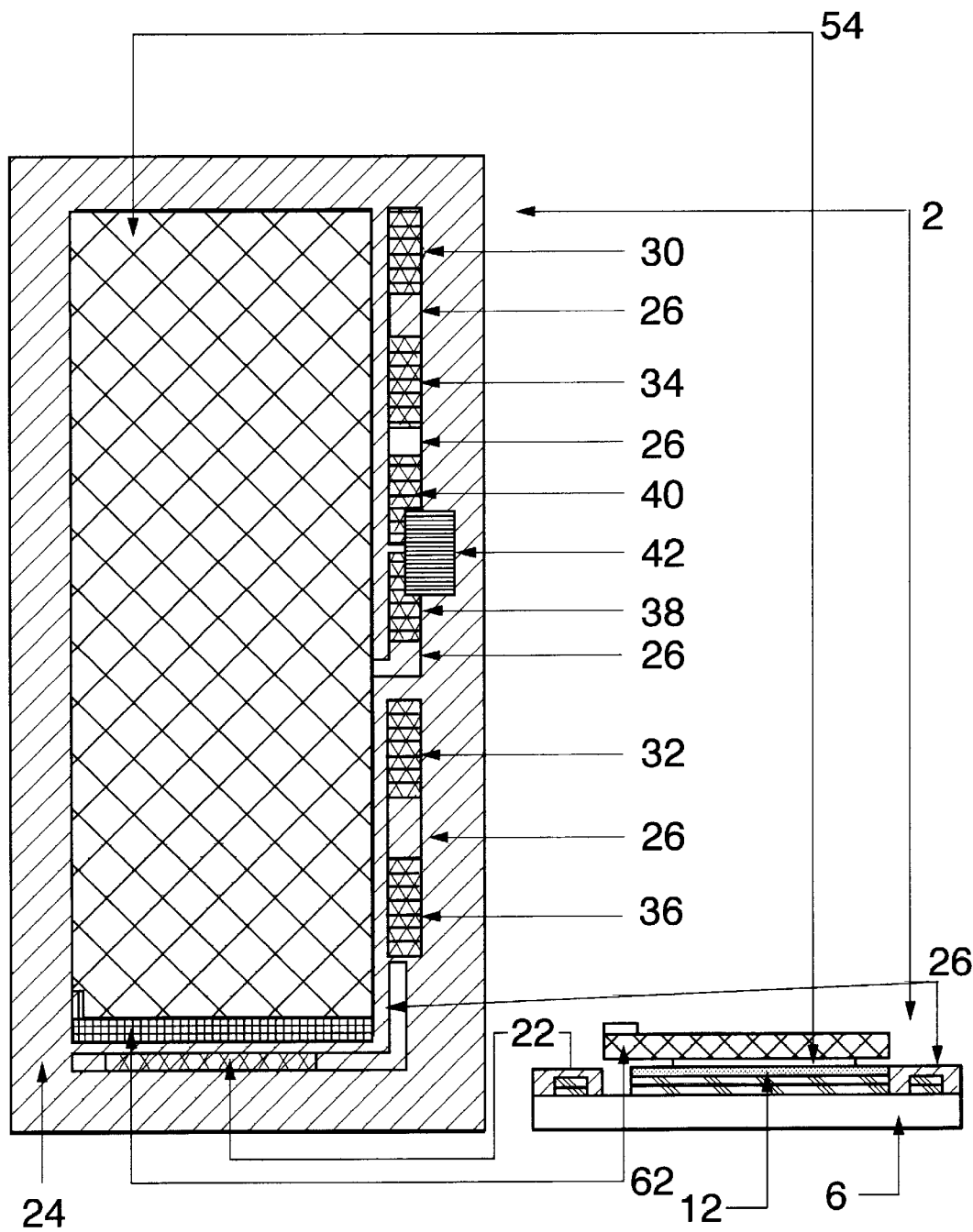
FIG. 7A is a front plan view of a printed circuit board having a solar chip & diode placement constructed in accordance with the present invention.
FIG. 7B is a side sectional view of a printed circuit board having a solar chip & diode placement constructed in accordance with the present invention.

Referring now to FIGS. 2A and 2B, the printed circuit board 2 is completely masked 24 and then, as shown in FIGS. 3A and 3B, etched again with a light technique to expose and define connection areas on the first charge pathway 8 comprised of generally rectangular first charge cell pad area 20, electrically connected by masked trace 26, to the first of two diode connection areas 38, continuing electrically by diode connection to the second of two diode connection pad 40, both to be more fully described in FIGS. 7A and 7B, electrically connected by masked trace 26, to the first charge component device connection area 34 and first charge power output connection area 30; and an opposing charge pathway comprised of a opposing charge connecting pad area 22, electrically connected by masked trace 26 to the opposing charge component device connection area 36 and opposing charge power output connection area 32.

It should be noted at this time that the diode connecting area one 38 and diode connection area two 40 may also be placed inversely on the opposing charge pathway 10. The masked trace lines 26 provide electrical connection between two prescribed pads while preventing electrical shorting to non connected pads as will be more fully explained below. The mask additionally defines a mask area surrounding the first charge cell pad area 28 that the solar chip 54 can sit down into. The mask area surrounding the first charge cell pad 28 is larger than first charge cell pad area 20 to further prevent against any shorting during opposing charge electrical connection to be more fully described in FIGS. 8A and 8B below. Referring once again to FIGS. 3A and 3B, the opposing charge connecting pad area 22 is specifically adjacent to and located away from one side of the first charge cell pad area 20. Said one side will coincide in drawing FIGS. 8A and 8B with the solar chip's 54 opposing charge main bus bar 62 to be more fully described in drawing FIGS. 8A and 8B. All other described connection areas are located adjacent and separate from their opposing charge pathways.

Referring now to FIGS. 4A and 4B, said generally rectangular first charge cell pad area 20, said opposing charge connecting pad area 22, said first charge device component connection area 34, said opposing charge device component connection area 36, said first charge power output connection area 30, said opposing charge power output connection area 32, said diode connection area one 38 and diode connection area two 40 are tinned 44 to provide ease of future electrical connection.

Figures 3A, 3B:
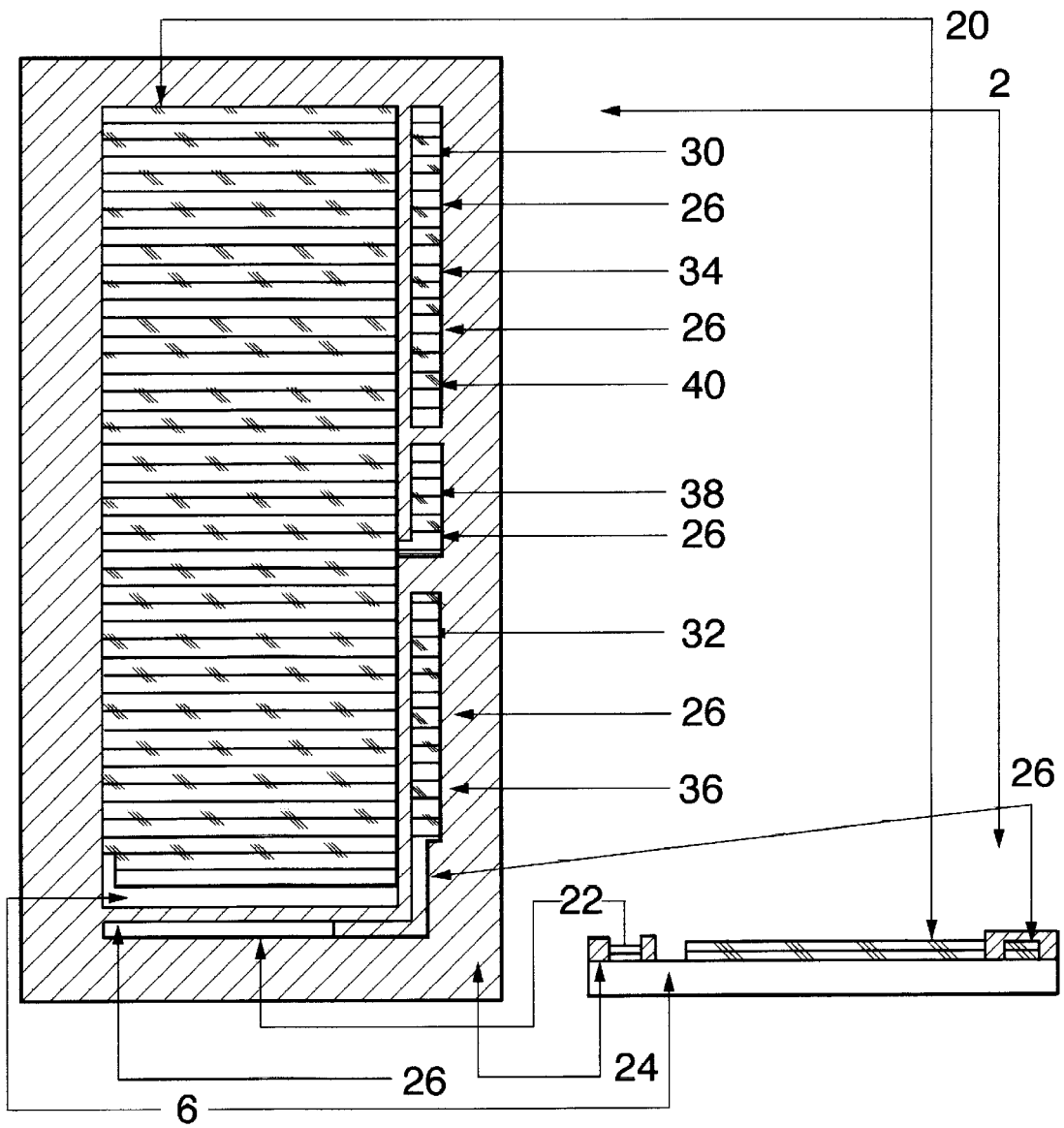
FIG. 3A is a front plan view of an etched copper and etched mask printed circuit board constructed in accordance with the present invention.
FIG. 3B is a side sectional view of a etched copper and etched mask printed circuit board constructed in accordance with the present invention.
Figures 5A, 5B:
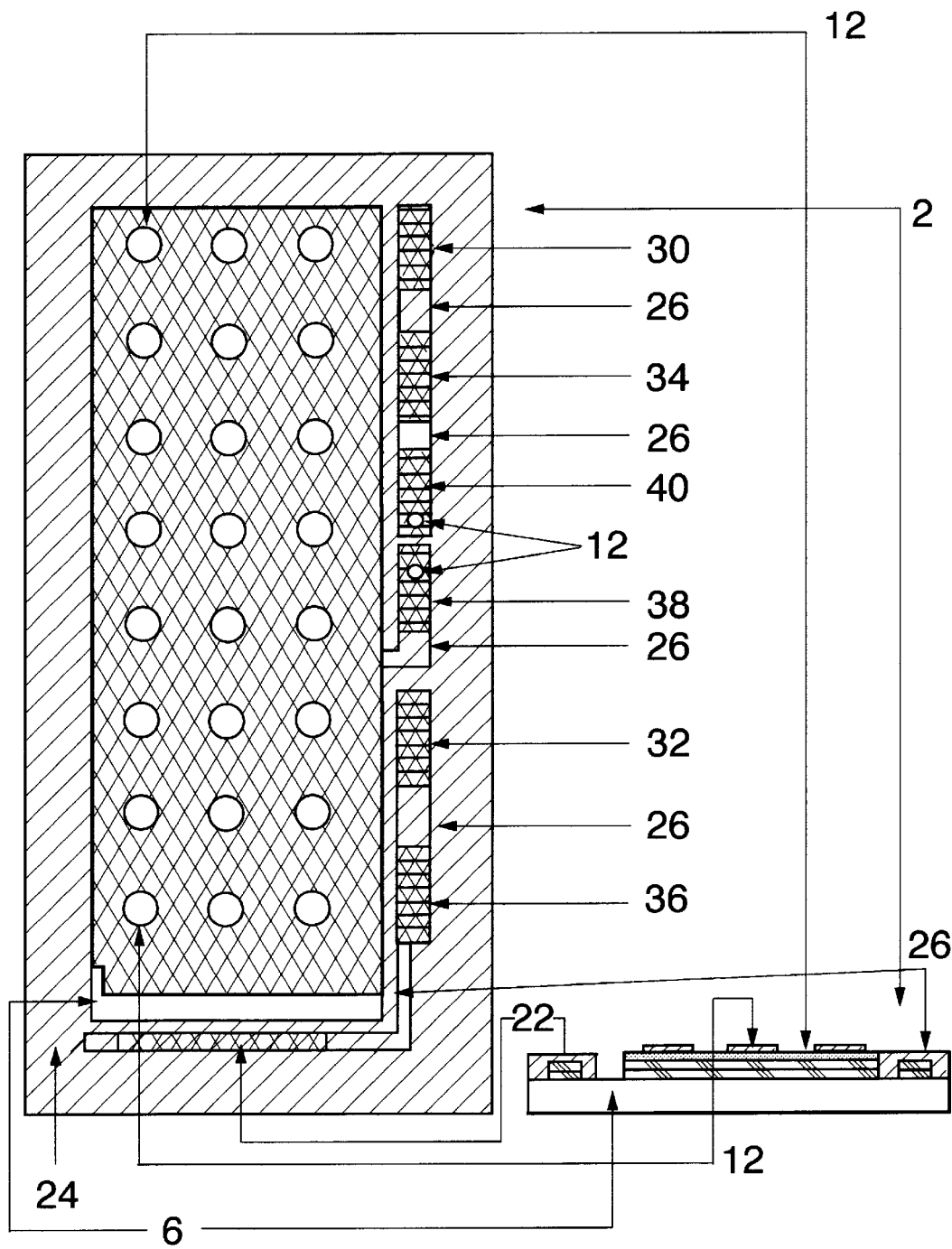
FIG. 5A is a front plan view of a printed circuit board having electrical and structural bonding material constructed in accordance with the present invention.
FIG. 5B is a side sectional view of a printed circuit board having electrical and structural bonding material constructed in accordance with the present invention.

Referring now to FIGS. 5A and 5B, the printed circuit board 2 having been etched to create bare etched copper trace and pad areas 4, FIGS. 1A AND 1B, masked FIGS. 2A AND 2B, mask etched FIGS. 3A AND 3B, and tinned FIGS. 4A and 4B; said first charge cell pad area 20, diode connection area one 38, and diode connection area two 40 are prepared with an electrical and structural bonding material 12 which in the preferred embodiment is a conductive epoxy. This process is typically applied by fluid dispensing techniques or stencil when done in mass production and then bonded by baking in IRC ovens as more fully described below in FIGS. 7A and 7B. The first charge cell pad area 20, diode connection area one 38, and diode connection area two 40 are now ready for placement of a solar chip 54 and light emitting diode 42 more fully described in FIGS. 7A and 7B below.

Figure 6A:
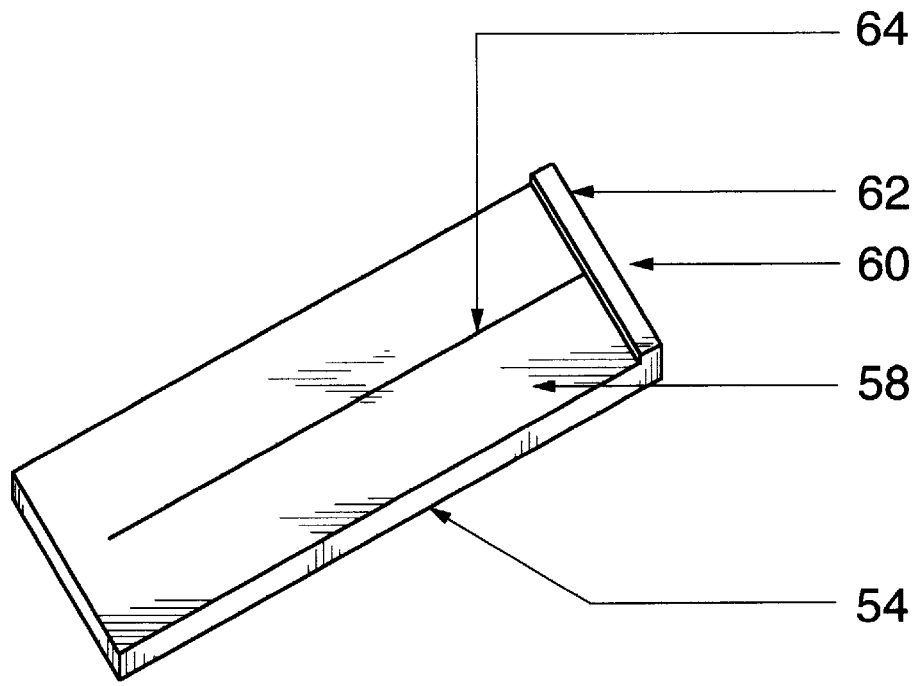
FIG. 6A is a top axonometric view of a single cut solar chip in accordance with the present invention.
Figure 6B:
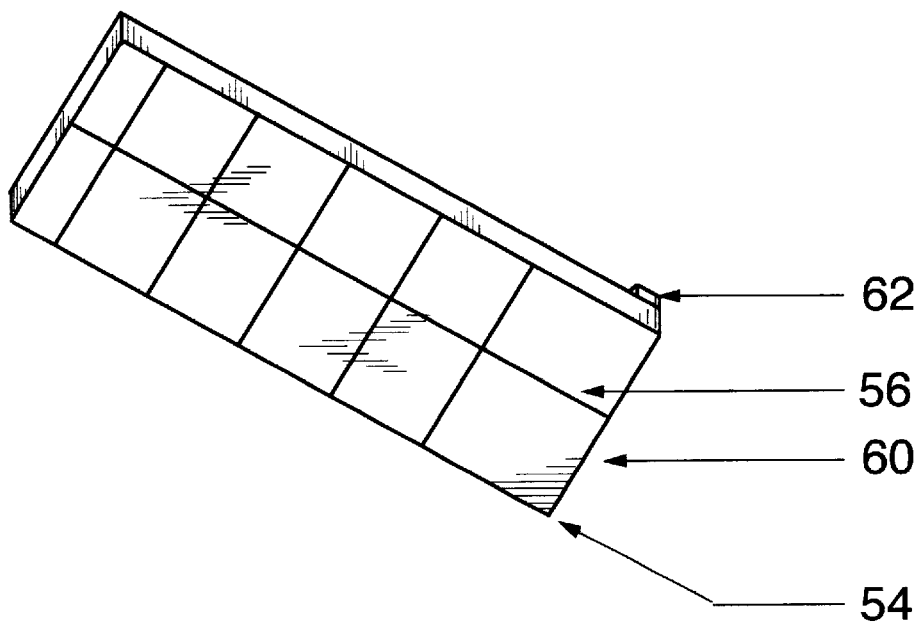
FIG. 6B is a bottom axonometric view of a single cut chip shown in accordance with the present invention.

Referring now to FIGS. 6A and 6B, a single solar chip 54 is shown. The solar chip 54 is cut to be larger than the first charge cell pad area 20 shown in FIG. 3A and equal to the mask surround the first charge cell pad area 28 shown in FIG. 3A. The solar chip additionally defines on the top opposing charge, light gathering side 58 an electrical finger 64 and opposing charge main bus bar 62 next to one edge or part of one edge of solar chip bus bar 60 coinciding in future placement with the side of the adjacent opposing charge connection pad area 22 for making an electrical connection as will be more fully described in FIGS. 8A and 8B.

Referring now to FIGS. 7A and 7B, the bottom first charge side conductive grid side 56 of solar chip 54 is now placed exactly onto the first charge cell pad area 20 exactly within the mask surrounding the first charge cell pad 28 with the opposing charge main bus bar 62 located adjacent to opposing charge connecting pad area 22 with a pick and place machine for alignment. In addition to the solar chip 54, a light emitting diode 42 is also picked and placed by machine onto diode connection area one 38 and diode connection area two 40.

Again referring to FIGS. 7A and 7B, the light emitting diode 42 stops any reverse flow of current in low light situations and shows the user when current is flowing. Then, the micro solar assembly is placed in an oven to heat bond the solar chip 54 and light emitting diode 42 to the first charge cell pad area 20, diode connection area one 38 and diode connection area two 40, respectively. The electrical and structural bonding of the light emitting diode 42 and bottom first charge conductive grid side 56 of the solar chip 54 complete the first charge pathway 8 connections.

Figures 8A, 8B:
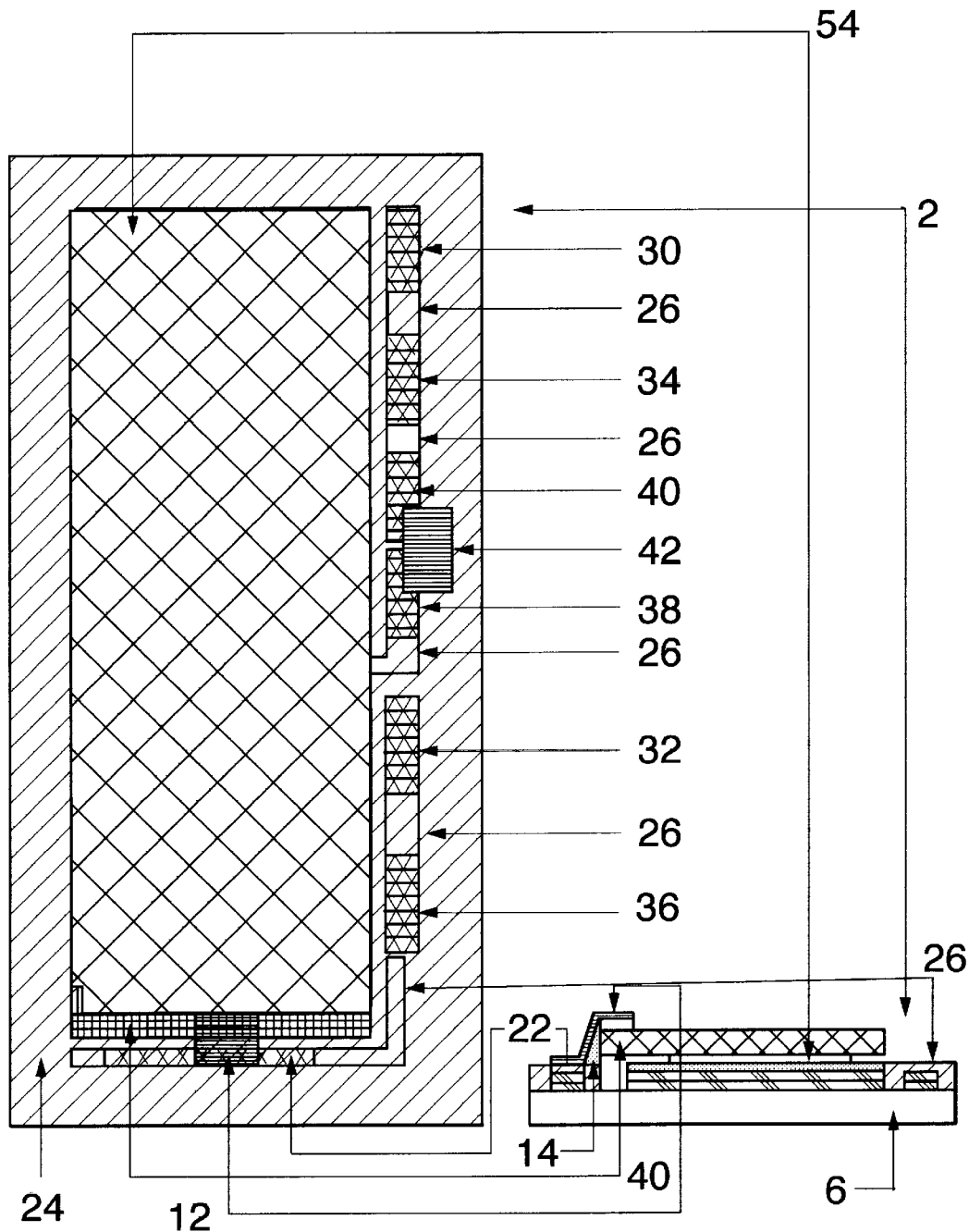
FIG. 8A is a front plan view of a printed circuit board having a solar chip's top bus bar electrically connected in accordance with the present invention.
FIG. 8B is a side sectional view of a printed circuit board having a solar chip's top bus bar electrically connected in accordance with the present invention.

Next, as shown in FIGS. 8A and 8B, an insulator is applied to the edge of solar chip with bus bar 60 and between said solar chip 54 and connecting pad area 22 to further prevent electrical shorting between the top opposing charge, light gathering side 58 and bottom first charge conductive grid side 56 of solar chip 54. Then, the top opposing charge, light gathering side 58 of solar chip 54 is electrically connected to opposing charge connecting pad 22 from the opposing charge main bus bar 62 by applying an electrical and structural bonding material 12 solder joint. The electrical connection from the opposing charge main bus bar 62 to opposing charge connecting pad area 22 now provides the final electrical connection for the opposing charge pathway 10.

Figures 9A, 9B:
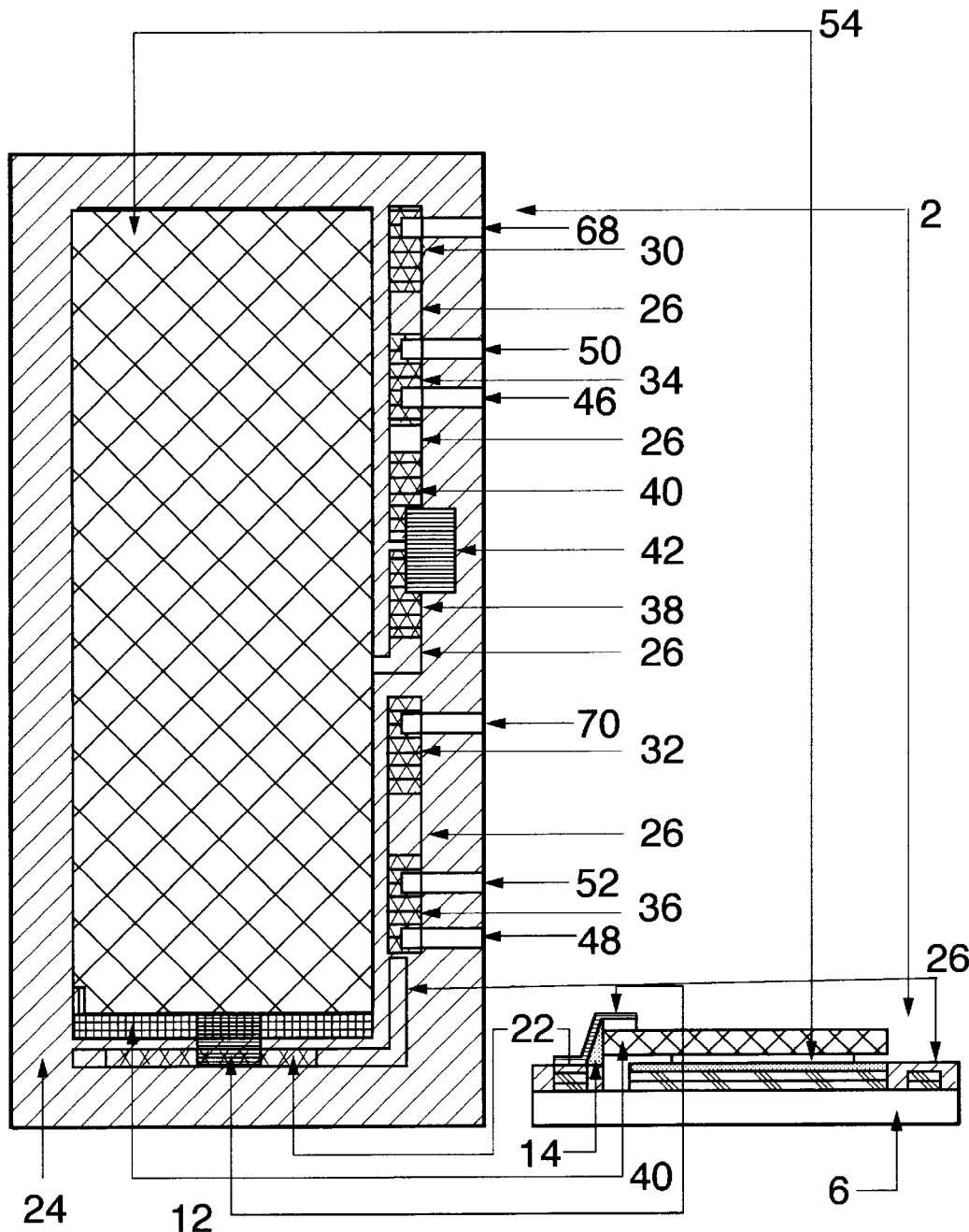
FIG. 9A is a front plan view of a printed circuit board having device component and device connections in accordance with the present invention.
FIG. 9B is a side sectional view of a printed circuit board having device component and device connections in accordance with the present invention..

Referring now to FIGS. 9A and 9B, with both the first charge pathway 8 and opposing charge pathway 10 fully connected any additional connections can easily be implemented at the first charge component device connection area 34 and opposing charge component device connection area 36 to add a low profile micro voltage regulator first charge connection 46 and a low profile micro voltage regulator opposing charge connection 48, voltage and current sensing device first charge connection 50, and voltage and current sensing device opposing charge connection 52, respectively. Also connections for first charge power output connection area 30 and opposing charge power output connection area 32 to connected to the charged electronic device by the first charge electronic device connection 68 and opposing charge electronic device connection 70 as shown in FIG. 9A. Said charged electronic device being any portable or non portable electronic device needing a supplemental photoelectric charge, i.e. cellular phones, beepers, laptop computers, GPS's, or marine transceivers, etc. the user for optimum placement of the micro solar assembly 66.

The low profile micro voltage regulator with its first charge and opposing charge connections 46 and 48 will lessen the voltage necessary to create a given voltage and provide a more constant voltage in varying lighting situations. The current and voltage sensing device with its first charge and opposing charge connections 50 and 52 will provide information to the user for optimum placement of the micro solar assembly 66.

Figure 10A:
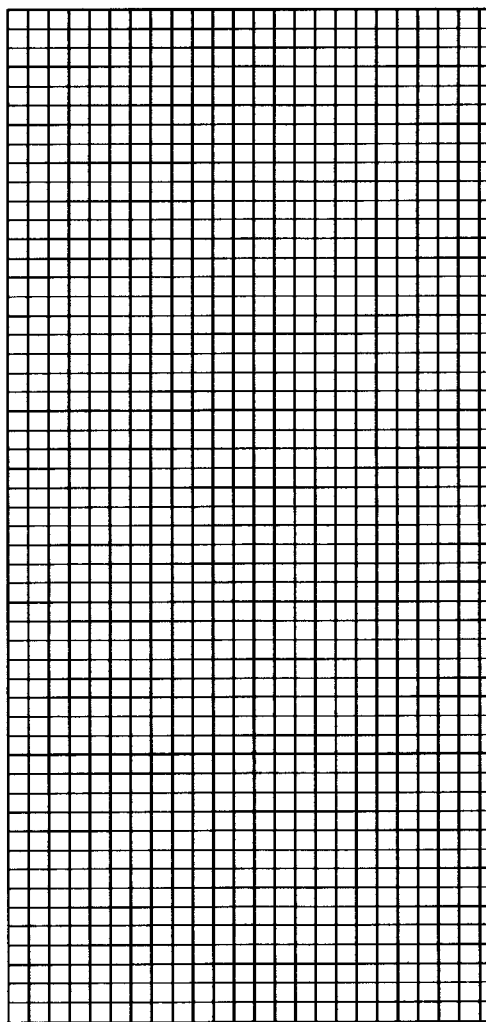
FIG. 10A is a front plan view of a printed circuit board having a polymer sealant sprayed or poured on top of the micro solar assembly in accordance with the present invention.
Figure 10B:
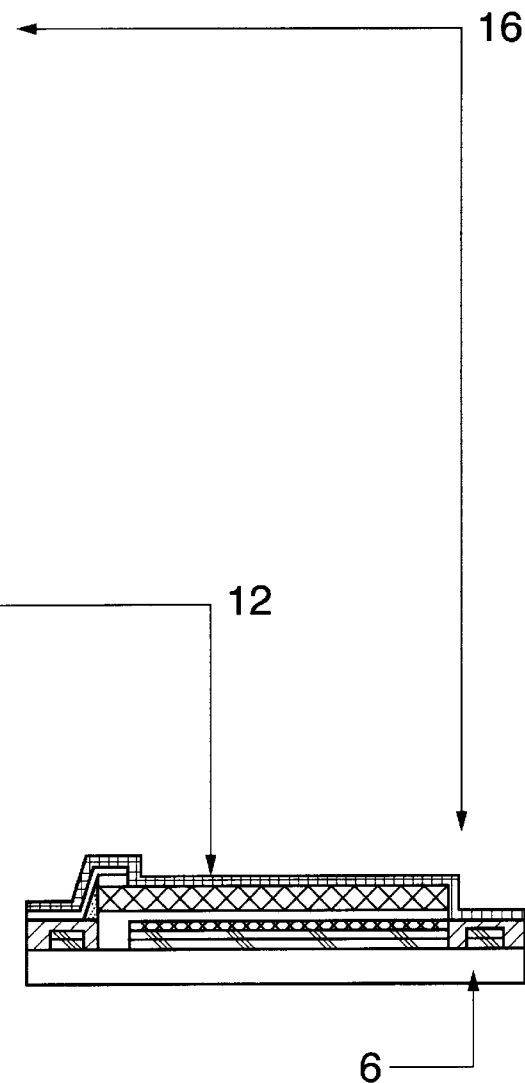
FIG. 10B is a side sectional view of a printed circuit board having a polymer sealant sprayed or poured on top of the micro solar assembly in accordance with the present invention.

Referring now to FIGS. 10A and 10B, with the first charge pathway 8 and opposing charge pathway 10 completed, a polymer sealant 16 can be spray applied to electrically seal and increase impact resistance thereby protecting the micro solar assembly.

Figures 11A, 11B:
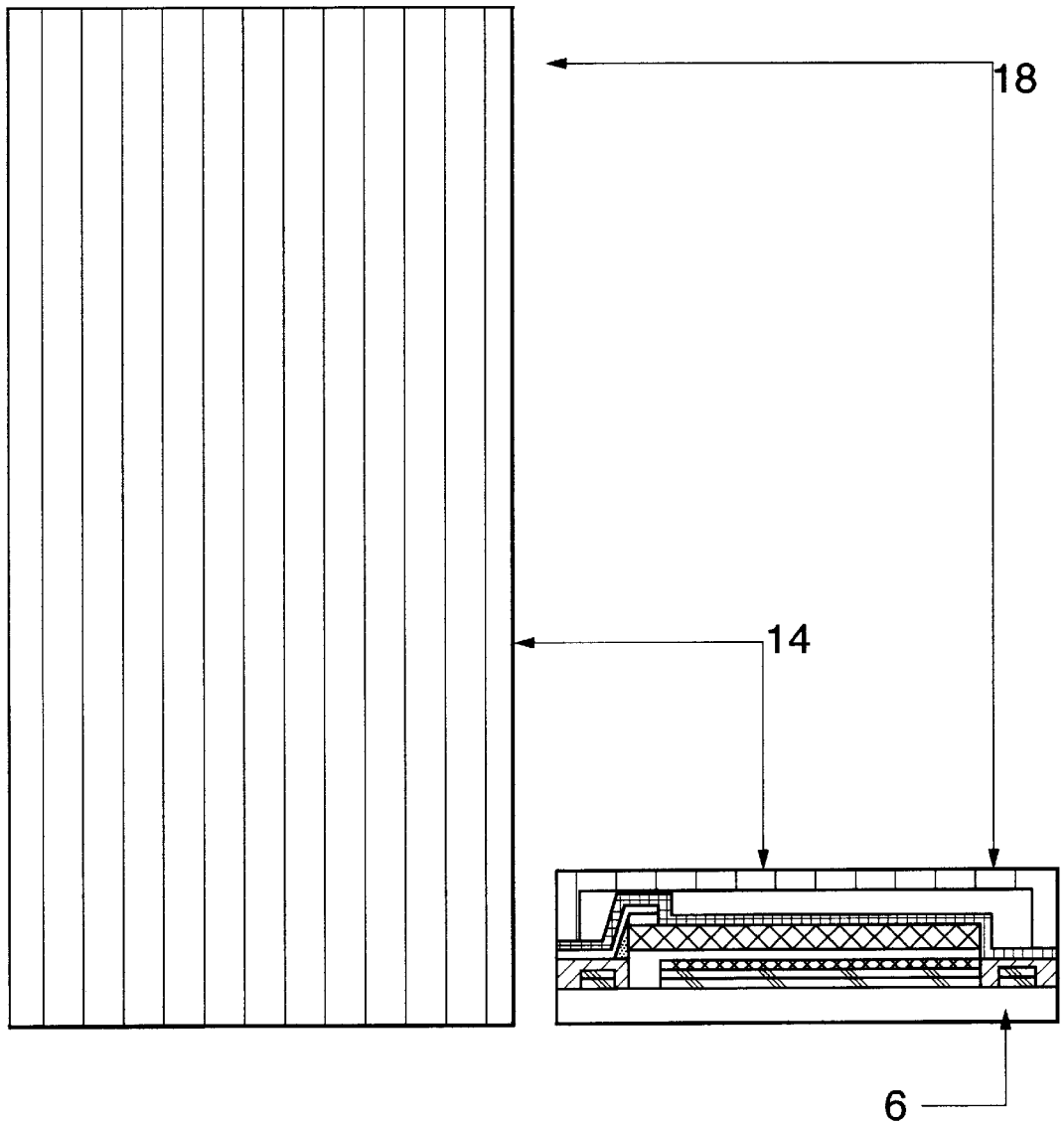
FIG. 11A is a front plan view of a printed circuit board having a plastic protective lens over the top of the micro solar assembly in accordance with the present invention.
FIG. 11B is a side sectional view of a printed circuit board having plastic protective lens over the top of the micro solar assembly in accordance with the present invention.

Referring now to FIGS. 11A and 11B, At this point the micro solar assembly is made ready for insertion into an electronic device by adding a plastic lens. The plastic lens cover 18 when secured to the printed circuit board 2 over the connections areas may be used to amplify the light onto a smaller solar chip 54 area thereby decreasing the cost of the solar chip 54 as well as furthering to protect the micro solar assembly 66 and providing for a more automated solar assembly component insertion into electronic devices.

While particular embodiments of the invention have been described, it is not intended that the invention be limited exactly thereto, as it is intended that the invention be as broad in scope as the art will permit. The foregoing description and drawings will suggest other embodiments and variations within the scope of the claims to those skilled in the art, all of which are intended to be included in the spirit of the invention as herein set forth.

What is claimed is:

1. A micro-solar assembly comprising:
   one side of a printed circuit board defining bare etched copper trace and pad connection areas along a first charge pathway and opposing charge pathway:
   (a) said first charge pathway defining a generally rectangular first charge cell pad area, diode connection area one and diode connection area two;
   (b) said opposing charge pathway defining an opposing charge connecting pad area adjacent and not connected to one side of the first charge cell pad area;
   (c) said diode connection area one and diode connection area two being electrically connected by a diode;
   (d) said diode connection area one being electrically connected by masked trace to said first charge cell pad area;
   (e) a solar chip having a bottom first charge conductive grid side electrically and structurally bonded to said first charge cell pad area, said solar chip having a top opposing charge light gathering side defining an opposing charge main bus bar, said opposing charge main bus bar being adjacent and electrically connected to said opposing charge connecting pad area;
   (f) said diode is a light emitting diode having two electrical and structural connections areas the first being electrically and structurally bonded to diode connection area one and the second being electrically and structurally bonded to diode connection area two.

2. A micro-solar assembly according to claim 1, wherein said printed circuit board having said diode is a light emitting diode.

3. A micro-solar assembly according to claim 1, wherein said printed circuit board defines a first charge component device connection area connected by masked trace to said diode connection area two of the first charge pathway, and a opposing charge component device connection area connected by masked trace to said opposing charge connecting pad area of said opposing charge pathway.

4. A micro-solar assembly according to claim 1, wherein said printed circuit board defines a first charge power output connection area connected by masked trace to said diode connection area two of the first charge pathway, and an opposing charge power output connection area connected by masked trace to said opposing charge connection pad area of said opposing charge pathway.

5. A micro-solar assembly according to claim 1, wherein an edge of said solar chip with bus bar is an insulator place on said edge of solar chip with bus bar.

6. A micro-solar assembly according to claim 1, wherein said micro solar assembly having a polymer sealant covering.

7. A micro-solar assembly according to claim 1, wherein said micro solar assembly having a plastic lens cover.

8. A micro-solar assembly comprising:
   one side of a printed circuit board defining bare etched copper trace and pad connection areas along a first charge pathway and opposing charge pathway:
   (a) said first charge pathway defining a generally rectangular first charge cell pad area, diode connection area one, diode connection area two, a first charge component device connection area, and a first charge power output connection area;

(b) said opposing charge pathway defining an opposing charge connecting pad area adjacent and not connected to one side of the first charge cell pad area, an opposing charge component device connection area, and an opposing charge power output connection area adjacent but not connected to the first charge pathway;

(c) said diode connection area one and diode connection area two being electrically connected by a diode;

(d) said diode connection area one being electrically connected by masked trace to said first charge cell pad area;

(e) said diode connection area two being electrically connected by masked trace to said first charge component device connection area and said first charge power output connection area adjacent and not connected to the opposing charge pathway;

(f) said opposing charge connecting pad area being electrically connected by masked trace to said opposing component device connection area and said opposing power output connection area adjacent and not connected to the first charge pathway;

(g) a solar chip having a bottom first charge conductive grid side electrically and structurally bonded to said first charge cell pad area, said solar chip having a top opposing charge light gathering side defining an opposing charge main bus bar, said opposing charge main bus bar being adjacent and electrically connected to said opposing charge connecting pad area;

(f) said diode having two electrical and structural connections areas the first being electrically and structurally bonded to diode connection area one and the second being electrically and structurally bonded to diode connection area two thereby electrically connecting said first charge cell pad area, first charge component device connection area, and first charge power output connection area along the first charge pathway.

* * * * *